(12) United States Patent
Kaiser et al.

(10) Patent No.: US 6,807,123 B2
(45) Date of Patent: Oct. 19, 2004

(54) CIRCUIT CONFIGURATION FOR DRIVING A PROGRAMMABLE LINK

(75) Inventors: Robert Kaiser, Kaufering (DE); Florian Schamberger, Bad Reichenhall (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/601,236

(22) Filed: Jun. 20, 2003

(65) Prior Publication Data

US 2004/0004892 A1 Jan. 8, 2004

Related U.S. Application Data

(63) Continuation of application No. PCT/DE01/04540, filed on Dec. 4, 2001.

(30) Foreign Application Priority Data

Dec. 20, 2000 (DE) .......................................... 100 63 688

(51) Int. Cl.[7] .............................................. G11C 7/00
(52) U.S. Cl. .............................. 365/225.7; 365/189.09; 365/189.12
(58) Field of Search ....................... 365/189.09, 189.12, 365/225.7, 200

(56) References Cited

U.S. PATENT DOCUMENTS

| | | | | |
|---|---|---|---|---|
| 5,367,208 A | * | 11/1994 | El Gamal et al. | ............. 326/44 |
| 5,572,458 A | * | 11/1996 | Smith et al. | .................. 365/96 |
| 5,668,818 A | | 9/1997 | Bennett et al. | |
| 5,671,183 A | | 9/1997 | Soenen et al. | |

FOREIGN PATENT DOCUMENTS

| | | |
|---|---|---|
| EP | 0115170 A2 | 8/1984 |
| EP | 0805451 A2 | 11/1997 |
| WO | 01/41150 A2 | 6/2001 |

* cited by examiner

Primary Examiner—Vu A. Le
(74) Attorney, Agent, or Firm—Laurence A. Greenberg; Werner H. Stemer; Ralph E. Locher

(57) ABSTRACT

A circuit configuration for driving a programmable link has a volatile memory cell, which is coupled to the fuse for the permanent storage of data stored in the volatile memory, and also a shift register, which enables data to be read out from the volatile memory cell and data to be written to the memory cell. In this case, a plurality of shift registers may be interconnected to form a shift register chain for the purpose of driving a plurality of fuses. The shift register chain thus enables fast writing and reading to/from the volatile memory with a low outlay on circuitry.

12 Claims, 1 Drawing Sheet

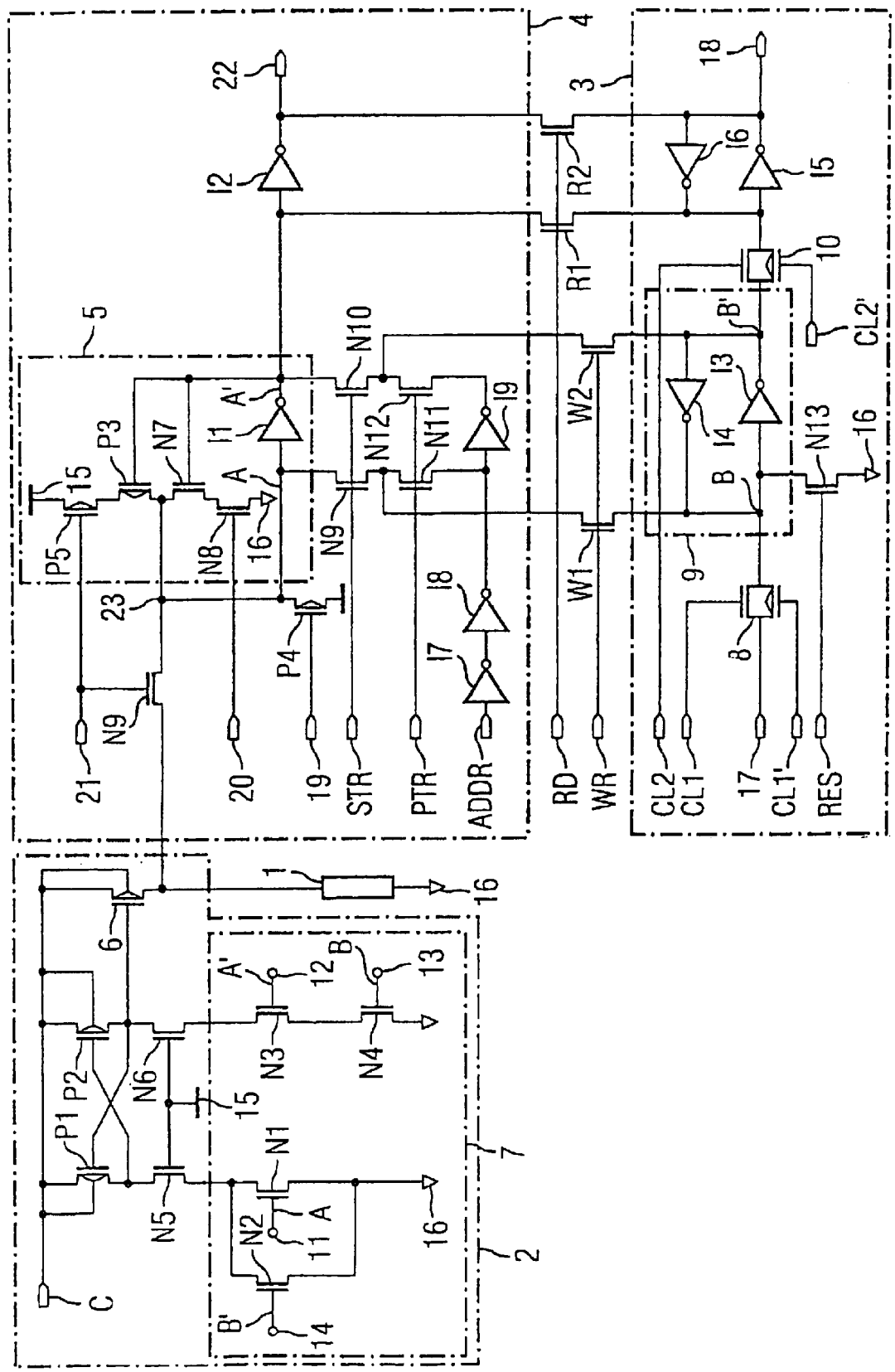

CIRCUIT CONFIGURATION FOR DRIVING A PROGRAMMABLE LINK

CROSS-REFERENCE TO RELATED APPLICATION

This application is a continuation of copending International Application No. PCT/DE01/04540, filed Dec. 4, 2001, which designated the United States and was not published in English.

BACKGROUND OF THE INVENTION

Field of the Invention

The present invention relates to a circuit configuration for driving a programmable link and to the use thereof in a memory chip.

In memory chips, for example synchronous dynamic random access memories (SDRAMs), having a memory space of 256 megabits, for example, memory cells which can compensate for production-dictated failures of individual memory cells are usually provided for the purpose of providing redundancy. For this purpose programmable links, also referred to as fuses, are provided, which enable defective memory cells to be replaced by intact replacement cells. A few thousand fuses are provided in 256-megabit RAMs by way of example.

The fuses can be permanently reprogrammed with regard to their state of conduction in a known manner either by an energy pulse in the form of a laser or by an electrical pulse, for example a voltage or current pulse. In this case, a distinction is made between what are called fuses, which can be put into a non-conducting (high-impedance) state from a conducting (low-impedance) state by an energy pulse described, and antifuses, which can be changed from a non-conducting state to a conducting state by application of an energy pulse.

In semiconductor memory chips, the so-called programming, activation or blowing of fuses, which is a one-time operation which permanently changes the fuse from a low-impedance to a high-impedance state or from a high impedance state to a low-impedance state, has usually been effected hitherto by a laser prior to encapsulation of the memory chip. However, this is associated with the disadvantage that it is no longer possible to repair defective memory cells after encapsulation of the chip.

Furthermore, it is customary to replace the memory cells of an entire word line in a memory chip, but the replacement of individual addresses of memory cells, so-called single address repair, is desirable.

When fuses are blown by current or voltage pulses, which is also possible, in principle, after encapsulation of a chip, the problem can arise that the simultaneous blowing of a plurality of fuses entails an impermissibly high current consumption in the circuit.

In a mass memory chip, it is normally desirable, on the one hand, to program a replacement of defective memory cells by redundant, intact memory cells in real time, since, in the case of present-day memory chip clock rates of above 100 MHz, it is not possible to blow fuses within a clock period, that is to say before the next potential access to the repaired memory cell. On the other hand, such fast memories are usually volatile memories, and so permanent programming of a fuse is additionally necessary.

SUMMARY OF THE INVENTION

It is accordingly an object of the invention to provide a circuit configuration for driving a programmable link that overcomes the above-mentioned disadvantages of the prior art devices of this general type, in which it is possible to rapidly read from and write to volatile memories coupled to the drive circuit for the programmable link.

With the foregoing and other objects in view there is provided, in accordance with the invention, a circuit configuration for driving a programmable link. The circuit configuration contains a volatile memory having an address input and a volatile memory cell connected to the address input for feeding in an information item. The volatile memory is coupled to the programmable link for permanently storing a datum from the volatile memory cell to the programmable link. A shift register has a register cell coupled to the volatile memory cell in a read direction and in a write direction for a data transfer between the register cell and the volatile memory cell.

The programmable link may be configured as a fuse or as an antifuse.

A programmable link configured as a fuse undergoes transition from a low-impedance to a high-impedance state of conduction upon application of an energy pulse. A programmable link configured as an antifuse undergoes transition from a high-impedance to a low-impedance state of conduction upon application of an energy pulse. The transition from one state of conduction to another is normally an irreversible operation in both cases.

For the addressing of a defective memory cell of an SDRAM or another memory module it is possible to provide a plurality of bits, for example, for each of which a circuit configuration described is provided. In this case, the respective shift registers may be connected to one another serially in order to form a shift register chain. In other words, an input of one shift register may be connected to an output of another shift register. With the shift register which is coupled to the register cell of the shift register in a read direction and in a write direction, it is possible to serially read from and write to the memory cells of the respective volatile memories respectively assigned to a programmable link. This requires a particularly low outlay on circuitry. The writing and reading can be effected particularly rapidly with the circuit configuration described.

With the programmable link, the information stored temporarily in the volatile memory cell is stored permanently. With the shift register described, the information items that are to be stored permanently, for example, are written to the respective memory cells of the assigned programmable links. Furthermore, the circuit configuration described enables a rapid read-out of the information items stored in the programmable links via the volatile memory, which is coupled to the programmable link for the read-out thereof, and also by use of the shift register or a shift register chain formed from a plurality of shift registers.

By way of example, a bit of an address of a defective memory cell, to be repaired, of an SDRAM can be stored in the memory cell of the volatile memory.

The coupling between the volatile memory and the programmable link for the permanent storage of a datum from the memory cell of the volatile memory can be effected by a drive circuit, for example, which provides an energy pulse necessary for blowing or programming the programmable link (fuse). In this case, the read direction is understood to be the data transfer from the memory cell or an output of the memory cell of the volatile memory into the shift register. In this case, the write direction is understood to be the data transfer from the register cell of the shift register to the memory cell or an input of the memory cell of the volatile memory.

In one preferred embodiment of the present invention, a write transistor is provided, which is connected to a write input by its control input and which couples the register cell to the memory cell by its controlled path and a read transistor is provided, which is connected to a read input by its control input and which couples an output of the memory cell to the shift register by its controlled path.

In a further preferred embodiment of the invention, a drive circuit is provided for driving the programmable link with an energy pulse, the drive circuit being coupled to the memory cell of the volatile memory for the communication of a data signal. The drive circuit enables a datum to be read out in a simple manner from the volatile memory and this data signal to be fed to the drive circuit. The fuse either may or may not be blown or programmed by the energy pulse, depending on whether, for example, a zero or a one is read out.

In a further preferred embodiment of the invention, the drive circuit for controlling the energy pulse is coupled to the shift register for the communication of an activation signal. In addition to the possibility of writing to and reading from the memory cell in the volatile memory by the shift register, the shift register can simultaneously be used for activating a fuse blowing operation. This enables targeted subsequent blowing of fuses which, for example, could not be programmed during a first programming attempt. Moreover, an impermissibly high blowing current as a result of blowing too many programmable links can simultaneously be prevented by virtue of the targeted selection of individual or a plurality of programmable links for blowing by the shift register. Moreover, the dual function described for the shift register enables a particularly space-saving circuit construction.

In a further preferred embodiment of the invention, the drive circuit has an AND logic circuit, which ANDs a data input with an activation input and has an output coupled to the programmable link. In the case of the AND logic circuit described in the drive circuit, the programmable link is blown given the presence of a blowing voltage only when an activation signal is present at an activation input and a data signal is present at a data input, which signal may be provided for example in the memory cell of the volatile memory.

In a further preferred embodiment of the present invention, the drive circuit has a blowing transistor, which, on the input side, is coupled to the volatile memory and which, at an output connected to the programmable link, provides an energy pulse. Accordingly, three conditions may be necessary for the provision of the energy pulse. The data signal must have a logic one, the activation signal must have a logic one, and a blowing voltage must be present at the blowing transistor. If all three conditions are met, the programmable link, which may be configured as an antifuse, for example, can be blown.

In a further preferred embodiment of the invention, the shift register has a respective switch on the input side and on the output side, which switch is connected to a respective clock signal input for its control. 25 bits may be necessary, for example, for addressing a 256-megabit SD RAM chip. Accordingly, 25 circuit configurations of the type described may be provided for the addressing and storage of the address of a defective memory cell in the SDRAM chip. In this case, the shift registers may be serially connected to one another to form a shift register chain via switches respectively provided on the input side and on the output side. This enables a clock-controlled read-in of data into the respective memory cells of the volatile memories, a read-out of data from the volatile memories with the register chain, and also an activation of drive circuits or blowing transistors for blowing programmable links likewise by the shift register chain.

In a further preferred embodiment of the invention, the switches in the shift register are CMOS transfer gates. The latter enable a particularly fast, serial data transfer for writing and reading.

In a further preferred embodiment of the present invention, the shift register has a further memory cell, which, on the output side, is connected to the switch connected downstream of the register cell. The further memory cell may be coupled to the output of the memory cell of the volatile memory for reading from the volatile memory.

In a further preferred embodiment of the present invention, the circuit configuration is constructed using CMOS circuit technology. This makes it possible to realize the circuit configuration with a particularly low current requirement and area requirement.

Other features which are considered as characteristic for the invention are set forth in the appended claims.

Although the invention is illustrated and described herein as embodied in a circuit configuration for driving a programmable link, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a circuit diagram of an exemplary embodiment of a circuit configuration according to the invention.

DESCRIPTION OF THE PREFERRED EMBODIMENTS

Referring now to the single FIGURE of the drawing in detail, there is shown a programmable link 1, which is configured as an antifuse and is connected to a supply voltage terminal 16 by one terminal and to a drive circuit 2 by a further terminal. The drive circuit 2 is connected to a shift register 3 for the feeding in of an activation signal B, B'. Furthermore, a volatile memory 4 is provided, which, on the one hand, is connected to the further terminal of the antifuse 1 for reading out the state thereof and, on the other hand, is connected to the drive circuit 2 for feeding a data signal A, A' to a data input 11, 12.

The drive circuit 2 contains an AND logic circuit 7, which combines the data signal A, A' and the activation signal B, B' with one another in a logical AND combination. Two NMOS transistors N1, N2 connected in parallel are provided for this purpose, of which a first NMOS transistor N1 has a control input connected to the data input 11, and a second NMOS transistor N2 has a control input having an activation input 14 for feeding in the activation signal B. Furthermore, further NMOS transistors N3, N4 are provided in the AND logic circuit 7 for feeding in respectively complementary or inverse data and activation signals A', B', which transistors are connected in series by their controlled paths, and of which transistors a first NMOS transistor N3 has a control input connected to the data input 12, for feeding in the complementary data signal A', and a second NMOS transistor N4 has a control input connected to an activation input 13 for feeding in a complementary activation signal B'.

The NMOS transistors N1, N3 with the data input 11, 12 are simultaneously part of a circuit for level boosting which, on the control side, is connected to a blowing transistor 6.

The circuit for level boosting, which is part of the drive circuit 2, has two cross-coupled PMOS transistors P1, P2, which are connected to the AND logic circuit 7 via further NMOS transistors N5, N6. On the output side of the circuit for level boosting P1, P2, N5, N6 there is connected the blowing transistor 6 embodied as a PMOS transistor which is connected by a load terminal to the antifuse 1 and also to the volatile memory 4 for reading out the state of the antifuse 1.

The volatile memory 4 contains a memory cell 5 formed from two inverters I1; P3, N7 connected to one another. In this case, a first inverter I1 is provided, at whose input the data signal A can be derived and at whose output a complementary or inverse data signal A' can be derived. A PMOS transistor P3 and an NMOS transistor N7, whose control inputs are connected to one another and to the output of the first inverter I1, form the second inverted, whose output is connected to the input of the first inverter I1. The inverters I1 and P3, N7 thus form, as memory cell, a feedback latch with self-latching.

At the memory cell 5, auxiliary inputs 19, 20, 21 are provided for the purpose of reading out the present state of the antifuse 1. First, with the auxiliary input 19 and a PMOS transistor P4 connected thereto by its control input, for reading out the state of the antifuse 1, a logic 1 is written to the memory cell 5 and self-latched there. Afterward, with auxiliary inputs 20, 21, which drive mutually complementary complementary metal oxide semiconductor (CMOS) transistors P5, N8 of the memory cell 5, a tristate is formed in the memory cell 5, which connects the memory cell 5, in particular the inverter P3, N7, to the supply voltage terminals 15, 16 in a high-impedance manner. An NMOS transistor N9 is conducting at the same time, which transistor is likewise connected to auxiliary input 21 for its control and is connected between a terminal of the antifuse 1 and an input of the memory cell 5. This has the effect that the circuit node at the input of the first inverter I1 in the memory cell 5 remains at high impedance if the antifuse 1 is likewise at high impedance, and undergoes transition to a low-impedance state if the antifuse 1 configured as an antifuse is at low impedance, that is to say has already blown. In the latter case, the input node of the first inverter I1, which provides the data signal A, discharges via transistor N9 and the antifuse 1, which is conducting in this case. As soon as the state of the antifuse 1, that is to say whether the antifuse is conducting at low impedance or at high impedance, is read out as logic 0 or 1 into the memory cell 5, the signals applied to the auxiliary inputs 20, 21 for this purpose are removed and the memory cell 5 undergoes transition to self-latching again. By an inverter I2, which is connected to the output of the first inverter I1 by its input, the data signal A or the inverse data signal A' can be read out from memory cell 5 at an output 22.

Furthermore, the memory cell 5 is coupled to an address input ADDR, which, on the input side, is connected to three series-connected inverters I7, I8, I9. Furthermore, for coupling the address input ADDR to the memory cell 5, two pairs of NMOS transistors N9, N10; N11, N12 are provided, the control inputs of which are connected to a strobe input STR and to a pointer input PTR. By the strobe and pointer signals on the selection lines strobe STR, pointer PTR, a bit of an address of a memory cell of an SDRAM, for example, can be written to the memory cell 5, in which case the memory cell in the SDRAM to which points the address of which one bit can be fed in at the input ADDR may be defective. If the address is defective, then the bit of the relevant defective memory cell address which is present at the address input ADDR can be written to the memory cell 5 by the selection lines strobe, pointer, STR, PTR, which can be activated for this purpose.

Permanent storage of the bit of the address of the defective memory cell cannot be made possible with the memory cell 5, however, since the latter only forms a volatile memory. Therefore, the drive circuit 2 described enables the read-out of the memory cell 5, that is to say of the data signal A, A' via the AND control logic 7 already described and also the permanent storage of the datum read out by the blowing transistor 6 in the antifuse 1. In this case, the AND logic circuit 7 combines the data signal A, A' with an activation signal B, B' in an AND combination. Consequently, the antifuse 1 is blown only when a logic 1 is stored in memory cell 5 and, in addition, a logic 1 is provided by the activation signal B, B' at the activation input 13, 14. Finally, a blowing operation for the antifuse 1 in accordance with the exemplary embodiment also requires a blowing voltage C to be present at the PMOS transistors P1, P2, which form the level boosting circuit already described, and at the blowing transistor 6.

In accordance with the present invention, the activation signal B. B' can then be provided by the shift register 3 in the register cell 9, which likewise has two negative feedback inverters I3, I4 which form a self-latching circuit. A switch 8, 10 embodied as a PMOS transfer gate is respectively connected to the input of the register cell 9 and to the output of the register cell 9. While the switch 8 connected on the input side can be driven by a first clock signal CL1, CL1', the switch 10 disposed on the output side can be driven by a second clock signal CL2, CL2', which can fed to the switch 10. The memory content of the register cell 9 can be reset via an NMOS transistor N13, which connects the input of the register cell 9 to the supply voltage terminal 16, and which is connected to a reset input RES on the control side. On the output side of register cell 9 and connected downstream of the output-side switch 10, the shift register 3 has a further self-latching circuit, which is realized with two likewise negative feedback inverters I5, I6 and couples the switch 10 to an output 18 of the shift register 3. The input of the shift register 3 which is connected to an input of the input-side switch 8 is designated by 17.

As already described, memory cells in SDRAM chips, which may have a memory space of 256 megabits, for example, are selected by addresses. Such an address may have 25 bits, for example. Accordingly, 25 of the circuits shown in the FIGURE, containing the antifuse 1, the drive circuit 2, the volatile memory 4 and the shift register 3, are necessary for the addressing of an individual memory cell of the SDRAM chip. However, in order to avoid an impermissibly high current flow, which may momentarily amount to approximately 1 MA per antifuse, during the blowing of the antifuses 1, the individual drive circuits 2 for the antifuses 1 with the shift register 3 may be selected or addressed successively or partly simultaneously. For this purpose the plurality of shift registers 3 can be connected to one another in a series circuit, in which case an input 17 of one shift register circuit 3 can respectively be connected to an output 18 of another shift register circuit 3. A shift register chain is formed as a result of this. The register cells 9 respectively connected to one another via switches 8, 10 can also be interpreted as a register. A bit pattern generator, not depicted in the present FIGURE, may be connected to the input of the first register cell. If only one antifuse is permitted to be blown at any one time, then a bit sequence which has only one logic 1 and is filled with zeroes can be provided by the bit pattern generator at the input of the shift register is chain. The logic 1 is then successively shifted through all the register cells 9 of the shift register, so that only one drive circuit 2 is activated at that time in each case by the respective activation signal B. The clock signals CL1, CL1' and CL2, CL2' are provided for controlling the sequence. If a plurality of antifuses 1 can be blown simultaneously, then it is also possible, of course, by use of shift register 3, for a plurality of directly successive ones or ones spaced apart by zeroes at an adjustable interval to be shifted through the shift register chain.

The circuit configuration described, with the fast volatile memory 4, enables a correction of defective memory cells in a mass memory chip in real time. By way of example, before the mass memory chip is switched off, the respective addresses of the defective memory cells can be written permanently, for which purpose the drive circuits 2 and the antifuse 1 are provided. Consequently, blowing of antifuses 1 for the permanent storage of defective addresses, more precisely addresses of defective memory cells, is made possible. This is still possible even after the encapsulation and housing of the mass memory chip, since the antifuse 1 is electrically drivable. Finally, the invention affords the advantage that not only can an impermissibly high blowing current occur as a result of the simultaneous blowing of too many antifuses, but that in addition an arbitrary number of antifuses 1 can be blown simultaneously and in an arbitrary order by use of bit patterns that can be generated arbitrarily and can be shifted through the register cells 9.

Furthermore, control terminals of two read transistors R1, R2 are connected to a read input RD. In this case, the controlled path of the first read transistor R1 couples the input of the further memory cell I5, I6 of the shift register 3 to the input of the second inverter I2 at the output of the memory cell 5. The second read transistor R2, by its controlled path, couples the output of the further memory cell I5, I6 of the shift register 3 to the output of the second inverter I2 and thus the output 22 of the volatile memory 4. Consequently, upon activation of the read line at the read input RD, the data stored in the memory cell 5 or the bit stored in memory cell 5 can be read out and written to the latch I5, I6, operated with self-latching, in a simple manner. For data transfer in the opposite direction, a respective control input of a respective first and second write transistor W1, W2, configured as NMOS transistors in the same way as the read transistors R1, R2, is connected to a write input WR. In this case, the controlled path of the first write transistor W1 couples the input of the register cell 9 to an input of the memory cell 5 and the second write transistor W2, by its controlled path, couples the output of the register cell 9 of the shift register 3 to an input of the memory cell 5 in the volatile memory 4.

The write and read transistors described bring about, in a simple manner, a coupling for bidirectional data transfer between the memory cell 5 and the register cell 9, that is to say between the volatile memory 4 and the shift register 3. Consequently, in conjunction with a particularly low area requirement, the shift register 3 fulfills a dual function. On the one hand, the memory cell 5 can be read from and written to simply and rapidly, and, on the other hand, an information item for activating the blowing transistor 6 for blowing the programmable link 1 configured as an antifuse can be communicated by use of the shift register.

We claim:

1. A circuit configuration for driving a programmable link, comprising:
    a volatile memory having an address input and a volatile memory cell connected to said address input for feeding in an information item, said volatile memory coupled to the programmable link for permanently storing a datum from said volatile memory cell to the programmable link; and
    a shift register having a register cell coupled to said volatile memory cell in a read direction and in a write direction for a data transfer between said register cell and said volatile memory cell.

2. The circuit configuration according to claim 1, further comprising:
    a write input;
    a write transistor having a control input connected to said write input, and a controlled path coupled between said register cell and said volatile memory cell in the write direction;
    a read input; and
    a read transistor having a control input connected to said read input and a controlled path coupled between an output of said volatile memory cell and said shift register.

3. The circuit configuration according to claim 1, further comprising a drive circuit for driving the programmable link with an energy pulse, said drive circuit being coupled to said volatile memory cell for receiving a data signal.

4. The circuit configuration according to claim 3, wherein said drive circuit for controlling a provision of the energy pulse is coupled to said shift register for receiving an activation signal.

5. The circuit configuration according to claim 4, wherein said drive circuit has an AND logic circuit for combining a data input with an activation input in a logical AND combination and an output coupled to the programmable link.

6. The circuit configuration according to claim 3, wherein said drive circuit has a blowing transistor with an input side coupled to said volatile memory cell and an output connected to the programmable link, said blowing transistor providing the energy pulse in a manner dependent on the data signal and an activation signal.

7. The circuit configuration according to claim 1, wherein said shift register has a first clock signal input, a first switch on an input side connected to said first clock signal input for controlling said first switch, a second clock signal input, and a second switch on an output side connected to said second clock signal input for controlling said second switch.

8. The circuit configuration according to claim 7, wherein said first and second switches are CMOS transfer gates.

9. The circuit configuration according to claim 7, wherein said shift register has a further register cell with an output connected to said second switch, said second switch connected downstream of said register cell.

10. The circuit configuration according to claim 1, wherein the circuit configuration is constructed using CMOS circuit technology.

11. A memory chip, comprising:
    a programmable link; and
    a circuit configuration for driving said programmable link for replacing a defective memory cell with a redundant memory cell, said circuit configuration containing:
        a volatile memory having an address input and a volatile memory cell connected to said address input for feeding in an information item, said volatile memory coupled to said programmable link for permanently storing a datum from said volatile memory cell to said programmable link; and
        a shift register having a register cell coupled to said volatile memory cell in a read direction and in a write direction for a data transfer between said register cell and said memory cell.

12. A circuit configuration, comprising:
    a programmable link;
    a volatile memory having an address input and a volatile memory cell connected to said address input for feeding in an information item, said volatile memory coupled to said programmable link for permanently storing a datum in said programmable link; and
    a shift register having a register cell coupled to said volatile memory cell in a read direction and in a write direction for a date transfer between said register cell and said memory cell.

* * * * *